United States Patent
Choi et al.

(10) Patent No.: US 9,484,215 B2
(45) Date of Patent: Nov. 1, 2016

(54) SULFUR AND FLUORINE CONTAINING ETCH CHEMISTRY FOR IMPROVEMENT OF DISTORTION AND BOW CONTROL FOR HAR ETCH

(71) Applicant: Lam Research Corporation, Fremont, CA (US)

(72) Inventors: Sanghyuk Choi, Santa Clara, CA (US); Joseph James Vegh, Fremont, CA (US); Kyeong-Koo Chi, Cupertino, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 14/675,227

(22) Filed: Mar. 31, 2015

(65) Prior Publication Data

US 2016/0293430 A1     Oct. 6, 2016

(51) Int. Cl.
*H01L 21/3065*     (2006.01)
*H01L 21/02*     (2006.01)

(52) U.S. Cl.
CPC ..... *H01L 21/3065* (2013.01); *H01L 21/02164* (2013.01)

(58) Field of Classification Search
None
See application file for complete search history.

(56) References Cited

U.S. PATENT DOCUMENTS

| | | | |
|---|---|---|---|
| 7,655,514 B2 | 2/2010 | Zhang et al. | |
| 9,184,060 B1* | 11/2015 | Lee | H01L 21/31144 |
| 2003/0003748 A1* | 1/2003 | Khan | H01J 37/32706 438/694 |
| 2003/0003752 A1* | 1/2003 | Deshmukh | H01L 21/32137 438/700 |
| 2009/0170333 A1* | 7/2009 | Sasano | H01L 21/76224 438/710 |
| 2015/0004796 A1* | 1/2015 | Kim | H01L 21/0273 438/719 |
| 2015/0054135 A1* | 2/2015 | Ho | B81C 1/00 257/618 |
| 2015/0097276 A1* | 4/2015 | Kim | H01L 29/66833 257/635 |

* cited by examiner

*Primary Examiner* — Anita Alanko
(74) *Attorney, Agent, or Firm* — Beyer Law Group LLP (57) ABSTRACT

In accordance with this disclosure, there is provided several inventions, including a method for etching a plurality of features in a stack comprising alternating layers above a substrate, comprising: providing a steady state flow of an etching gas, wherein the etching gas comprises: a molecule A comprising sulfur and fluorine; a molecule B comprising carbon, fluorine, and hydrogen; and a molecule C comprising carbon and fluorine and not hydrogen; forming the etching gas into a plasma; and etching the features into the stack through the plurality of alternating layers.

14 Claims, 8 Drawing Sheets

SULFUR AND FLUORINE CONTAINING ETCH CHEMISTRY FOR IMPROVEMENT OF DISTORTION AND BOW CONTROL FOR HAR ETCH

BACKGROUND OF THE INVENTIONS

The present invention relates to the formation of semiconductor devices. More specifically, the invention relates to the etching of high aspect ratio features for semiconductor devices.

During semiconductor wafer processing, 3D flash memory devices may be created using multiple cells, which are stacked up together in chain format to save space and increase packing density. One common arrangement is an ONON structure, which includes alternating layers of Silicon Oxide (the "O") and Silicon Nitride (the "N"). These stacks may be etched to produce features as part of methods for making 3D structures such as NAND flash memory chips.

SUMMARY OF THE INVENTIONS

In accordance with this disclosure, there are provided several inventions, including a method for etching a plurality of features in a stack comprising alternating layers above a substrate, comprising: providing a steady state flow of an etching gas, wherein the etching gas comprises: a molecule A comprising sulfur and fluorine; a molecule B comprising carbon, fluorine, and hydrogen; and a molecule C comprising carbon and fluorine and not hydrogen; forming the etching gas into a plasma; and etching the features into the stack through the plurality of alternating layers.

These and other features of the present inventions will be described in more detail below in the detailed description and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION

The present disclosure will now be described in detail with reference to a few of the embodiments thereof as illustrated in the accompanying drawings. In the following description, specific details are set forth in order to provide a thorough understanding of the present invention. However, the present invention may be practiced without some or all of these specific details, and the disclosure encompasses modifications which may be made in accordance with the knowledge generally available within this field of technology. Well-known process steps and/or structures have not been described in detail in order to not unnecessarily obscure the present disclosure.

Etching is typically done in a plasma chamber, using etch plasmas based on various gases that are useful for etching through the layers of the stack. Typically, ONON mold etch chemistries are based on gases containing the elements carbon, hydrogen, fluorine, oxygen, and nitrogen, in a number of configurations. However, current technologies may have difficulty controlling the shape of the contact profile. Generally, when a high aspect ratio feature is to be etched, it is advantageous to keep the profile as straight as possible from top to bottom. However, there is typically a bow in the critical dimension ("CD") somewhere along the length of the feature. Also, if the feature is formed by a circular window in a mask, there is no guarantee that the feature will maintain that circular shape during the etching. Thus, at the bottom of the feature after etching is done, it may have an elliptical or irregular profile, which may be an unwanted result for many applications. It is beneficial, however, to use processes in which feature bowing is minimized, and in which the shape at the bottom of the features is less distorted.

In one embodiment, an etching gas containing sulfur and fluorine may be used to etch through stack of an alternating structure on a substrate, such as an ONON structure for use in a three-dimensional NAND high aspect ratio contact (HARC). For example, one may etch high aspect ratio contacts in alternating layers of an ONON stack, which may be patterned using a carbon-based mask layer. The number of layers may, for example, be 80 layers or higher (e.g., 100, or 120). Lower numbers of layers may also be used, such as 80, 40, 20, 10, or fewer. Alternatively, the alternating structures may comprise layers of silicon oxide and polysilicon (OPOP). The processes described herein may also be performed on non-alternating structures, structures that alternate between three or more different layer types, structures in which one or more consecutive layers of one type are alternated with one or more layers of another type, or single tall layers (such as $SiO2$) in which features have a high aspect ratio. Alternatively, the structure may not be a circular contact, but instead a high aspect ratio ("HAR") trench of any length.

As used herein, "high aspect ratio" as applied to features in a substrate refers to aspect ratios on the order of approximately 30:1 or higher. More preferably, this range may include ratios greater than 40:1, 50:1, 60:1, 70:1, 80:1, etc., or higher. However, the processes described herein may be beneficial for lower aspect ratios, such as 20:1, or 10:1.

The stacks may be used for different uses, such as 3D memory, a 3D NAND, or a DRAM capacitor.

There are many types of mask layers that may be used with the described embodiments, which will include any such layer known in the art which may serve as an etching mask. For example, the mask may be a carbon hard mask, such as amorphous carbon.

Figure 1:
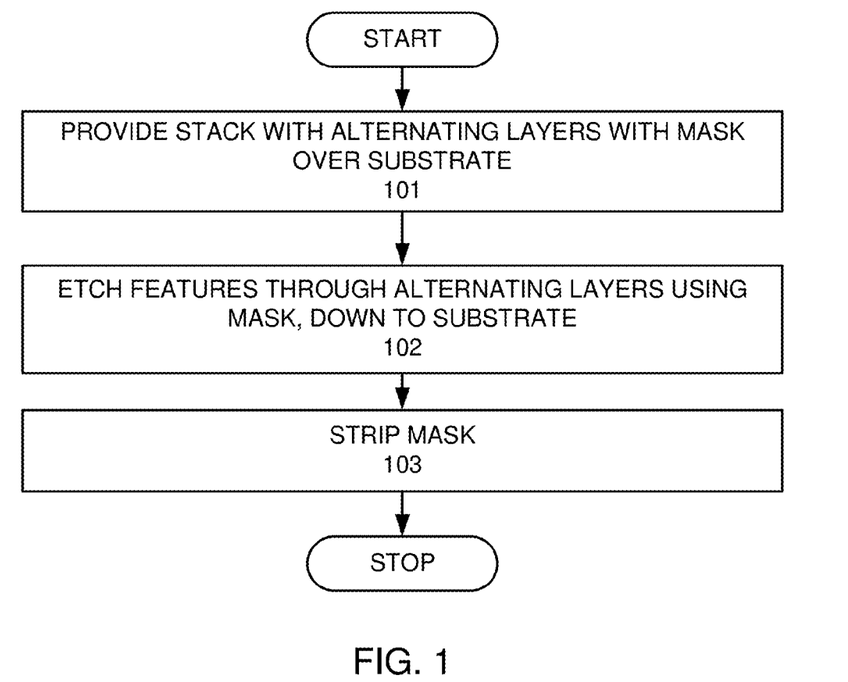
FIG. 1 is a high-level flowchart of a process that may be used to etch through a plurality of features in a stack.

FIG. 1 is a high-level flowchart of a process to be used in accordance with embodiments described herein. In this embodiment, a stack may be provided (step 101) with alternating layers over a substrate, with a mask. Using the mask, features may be etched (step 102) through the alternating layers, down to the substrate. Alternatively the etching may stop short of the substrate, or may continue to etch into the substrate. The mask may then be stripped (step 103).

Figure 2:
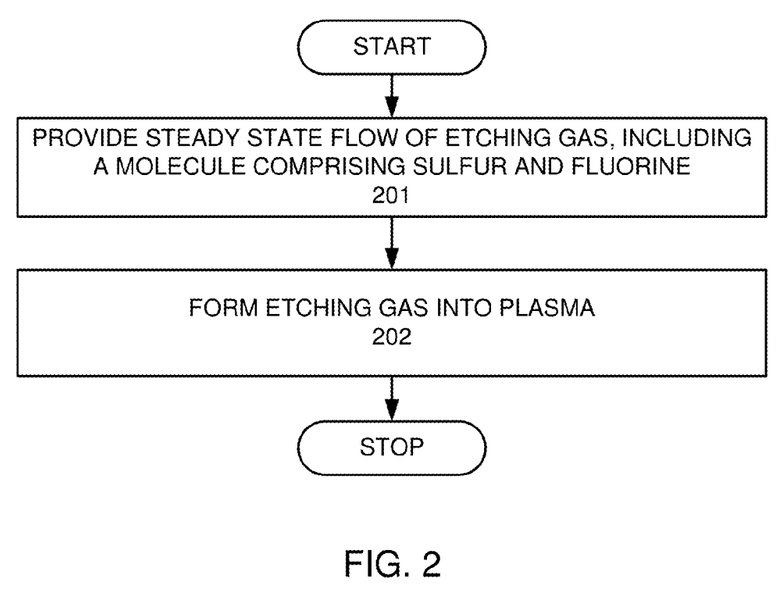
FIG. 2 is a high-level flowchart of a process for forming a plasma for etching.

FIG. 2 is a more detailed flowchart of a process for forming an etching gas, to be used with the described embodiments. A steady state flow of an etching gas may be provided, which includes any molecule comprising sulfur and fluorine (step 201). In some embodiments, this may include compounds that are a combination of carbon, sulfur, fluorine, or carbon, sulfur, fluorine, and hydrogen. An embodiment of such a molecule would be $SF_6$, and other embodiments would include $S_2F_{10}$, $SF_2$, and $SF_4$. The etching gas may then be formed into a plasma (step 202) as described in embodiments herein, or according to methods known in the art.

Figure 3:
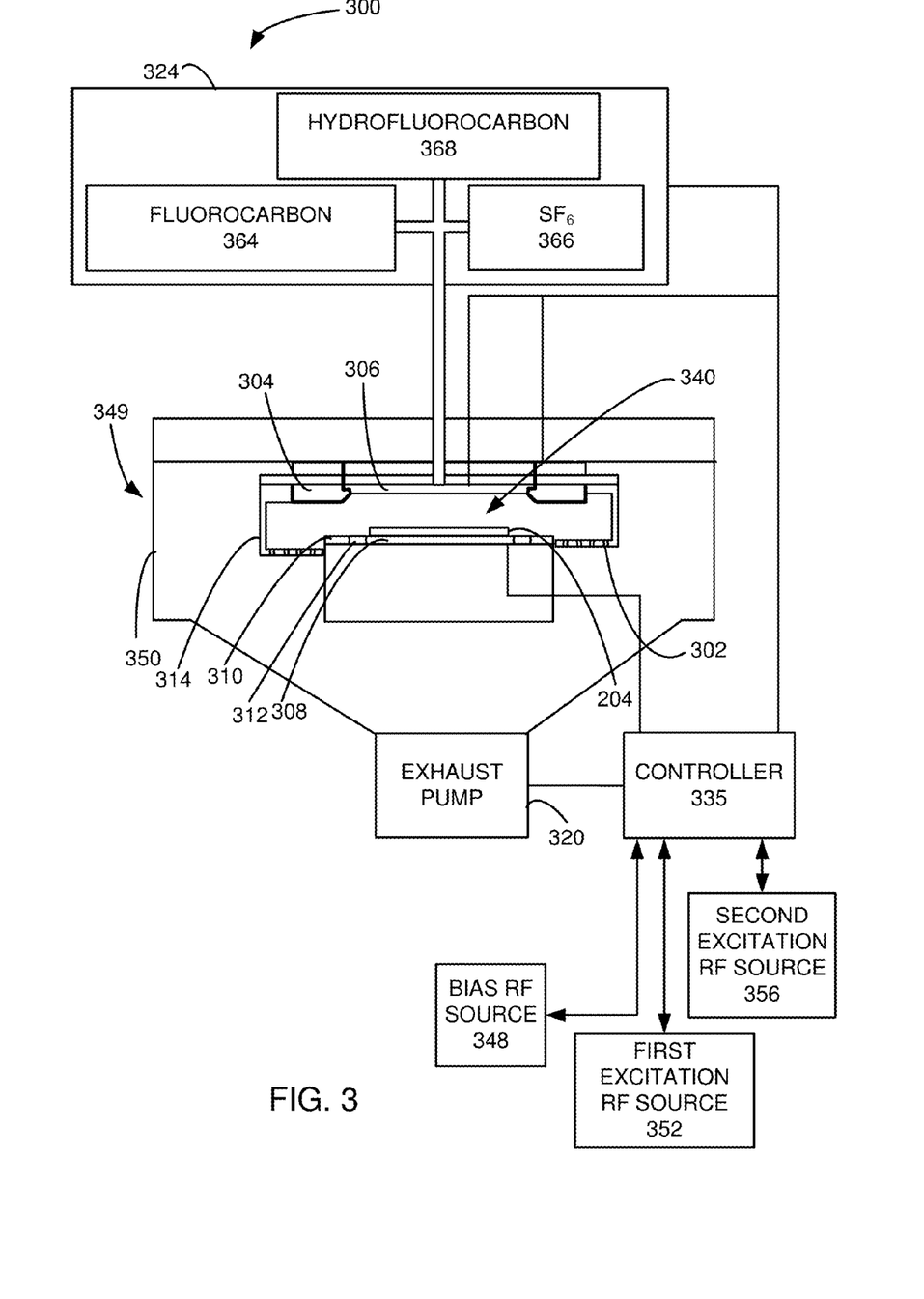
FIG. 3 is a schematic view of a processing chamber that may be used in practicing the inventions.

In the etching process (step 102), the stack with alternating layers may be placed in an etching chamber. In one embodiment, this etching chamber may comprise confinement rings. FIG. 3 is a schematic view of a plasma processing chamber that may be used for one or more of the following steps. An etch reactor 300 may comprise a top central electrode 306, top outer electrode 304, bottom central electrode 308, and a bottom outer electrode 310, within a plasma processing chamber 349, enclosed by a chamber wall 350. A bottom insulator ring 312 may insulate the bottom central electrode 308 from the bottom outer electrode 310. Also within the plasma processing chamber 349, the substrate 204 may be positioned on top of the bottom central electrode 308. The bottom central electrode 308 may provide an electrostatic chuck (ESC) for holding the substrate 204. In this embodiment, the bottom outer electrode 310 and the top outer electrode 304 have apertures that have a larger diameter than the substrate 204, so that the substrate 204 is positioned within the apertures.

A gas source 324 may be connected to the plasma processing chamber 349 to supply the etch gas into a plasma region 340 of the plasma processing chamber 349 during the etch processes. In this example, the gas source 324 comprises a $SF_6$ gas source 366, a hydrofluorocarbon containing gas source 368, and an additional source 364 including fluorocarbons. The gas source 324 may also comprise other gas sources.

A bias RF source 348, a first excitation RF source 352, and a second excitation RF source 356 may be electrically connected to the plasma processing chamber 349 through a controller 335 to provide power to the electrodes 304, 306, 308, and 310. The bias RF source 348 may generate bias RF power and may supply the bias RF power to the plasma processing chamber 349. In this example, the bias RF power has a frequency of 2 MHz. The first excitation RF source 352 generates source RF power and supplies the source RF power to the plasma processing chamber 349. In this example, this source RF power has a frequency of 27 MHz. The second excitation RF source 356 may generate another source RF power and supply the source RF power to the plasma processing chamber 349, in addition to the RF power generated by the first excitation RF source 352. In this example, this source RF power has a frequency of 60 MHz.

The different RF signals may be supplied to various combinations of the top and bottom electrodes. In one configuration, the lowest frequency of the RF is applied through the bottom electrode on which the material being etched is placed, which in this example is the bottom central electrode 308. In this example, the top electrodes are grounded and power is only provided to the bottom central electrode 308.

A C-shroud 314 may extend from the top outer electrode 304 to the bottom outer electrode 310 to provide additional plasma containment. The C-shroud 314 may have a plurality of apertures 302 to allow gas and plasma to flow out of the C-shroud 314. In this embodiment, the C-shroud 314 is grounded.

The controller 335 may be connected to the gas source 324, the bias RF source 348, the exhaust pump 320, the first excitation RF source 352, and the second excitation RF source 356. The controller 335 may also control the flow of the etch gas into the plasma processing chamber 349, the chamber pressure, as well as the generation of the RF power from the three RF sources 348, 352, 356, the electrodes 304, 306, 308, and 310, and the exhaust pump 320.

The top central electrode 306 may also serve as a gas distribution plate, which is connected to the gas source 324, and may serve as a gas inlet for gas from the gas source 324. The exhaust pump 320 may serve as a gas outlet removing gas, which passes from the top central electrode 306 through the plasma region 340 through apertures 302 to the exhaust pump 320. The exhaust pump 320 may help to regulate pressure.

A Flex GX® dielectric etch system made by Lam Research Corporation™ of Fremont, Calif. may be used in one embodiment of the claimed inventions. In the Flex GX, the upper electrodes and the C-shroud are grounded. In additional embodiments, Flex FX® and Flex EX+® systems may also be used.

In other embodiments, an ICP (inductive coupled plasma) reactor or other sources like surface wave, microwave, or electron cyclotron resonance ECR may be used.

In one embodiment, the pressure may be between 8-50 mTorr. Depending on the circumstances, higher or lower pressures may be included as applicable pressure ranges, or any of the sub-ranges within this range.

Figure 4:
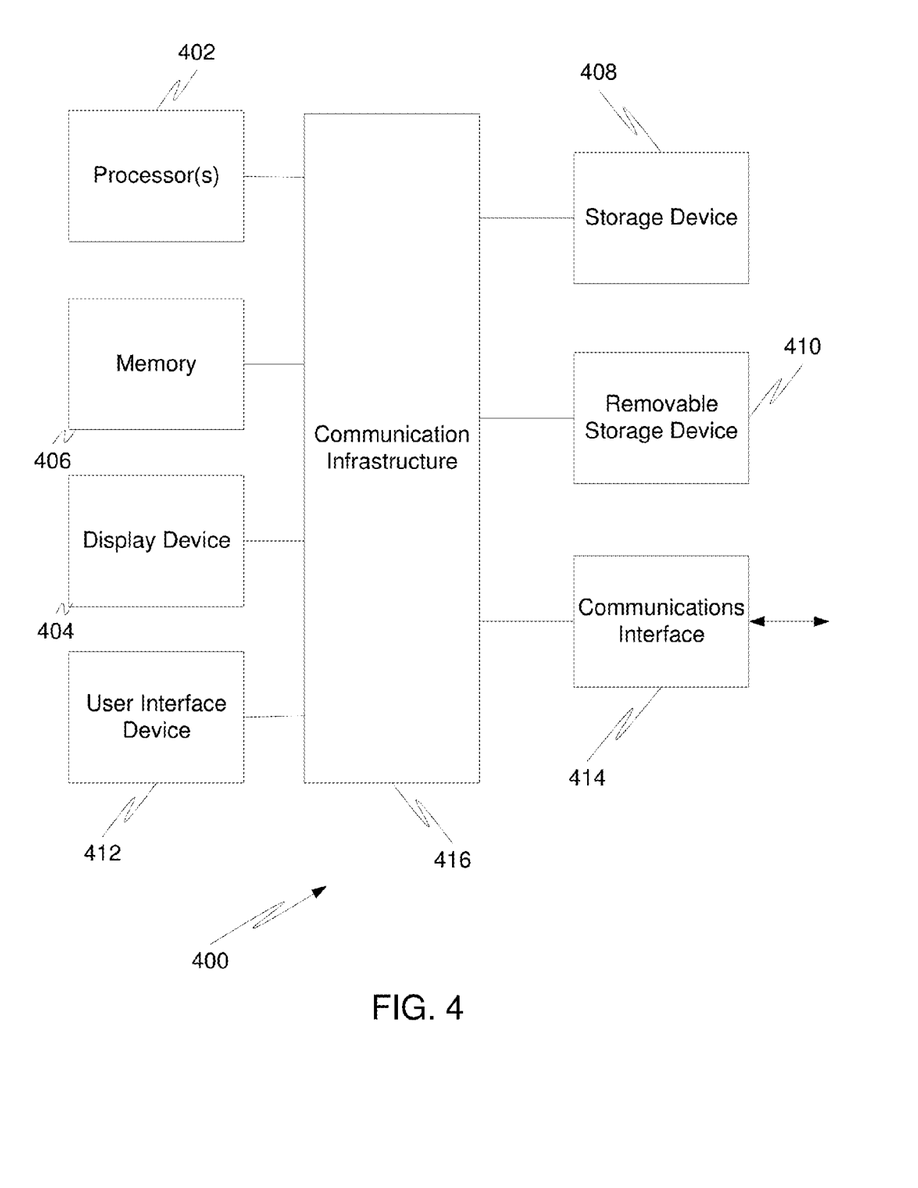
FIG. 4 illustrates a computer system for implementing a controller used in embodiments of the present inventions.

FIG. 4 is a high level block diagram illustrating a computer system 400 for implementing a controller used in embodiments of the present inventions. The computer system may have many physical forms ranging from an integrated circuit, a printed circuit board, and a small handheld device up to a huge super computer. The computer system 400 may include one or more processors 402, and further can include an electronic display device 404 (for displaying graphics, text, and other data), a main memory 406 (e.g., random access memory (RAM)), storage device 408 (e.g., hard disk drive), removable storage device 410 (e.g., optical disk drive), user interface devices 412 (e.g., keyboards, touch screens, keypads, mice or other pointing devices, etc.), and/or a communication interface 414 (e.g., wireless network interface). The communication interface 414 may allow software and/or data to be transferred between the computer system 400 and external devices via a link. The system may also include a communications infrastructure 416 (e.g., a communications bus, cross-over bar, or network) to which the aforementioned devices/modules may be connected.

Information transferred via communications interface 414 may be in the form of signals such as electronic, electromagnetic, optical, or other signals capable of being received by communications interface 414, via a communication link that carries signals and may be implemented using wire or cable, fiber optics, a phone line, a cellular phone link, a radio frequency link, and/or other communication channels. With such a communications interface, it is contemplated that the one or more processors 402 might receive information from a network, or might output information to the network in the course of performing the above-described method steps. Furthermore, method embodiments of the present invention may execute solely upon the processors or may execute over a network such as the Internet in conjunction with remote processors that shares a portion of the processing.

The term "non-transient computer readable medium" is used generally to refer to media such as main memory, secondary memory, removable storage, and storage devices, such as hard disks, flash memory, disk drive memory, CD-ROM and other forms of persistent memory and shall not be construed to cover transitory subject matter, such as carrier waves or signals. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

Figure 5A:
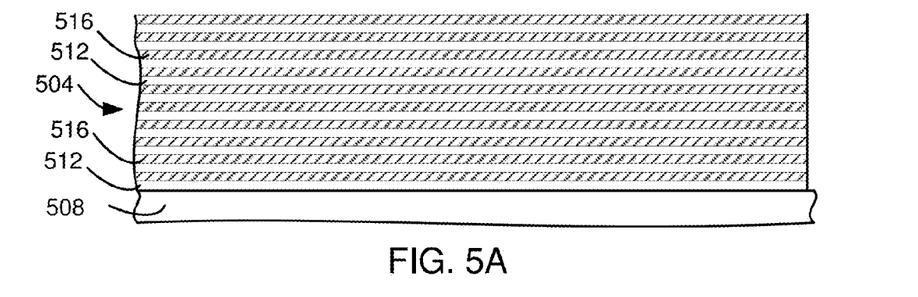
FIGS. 5A-5B are schematic cross-sectional views of a memory stack.
Figure 5B:
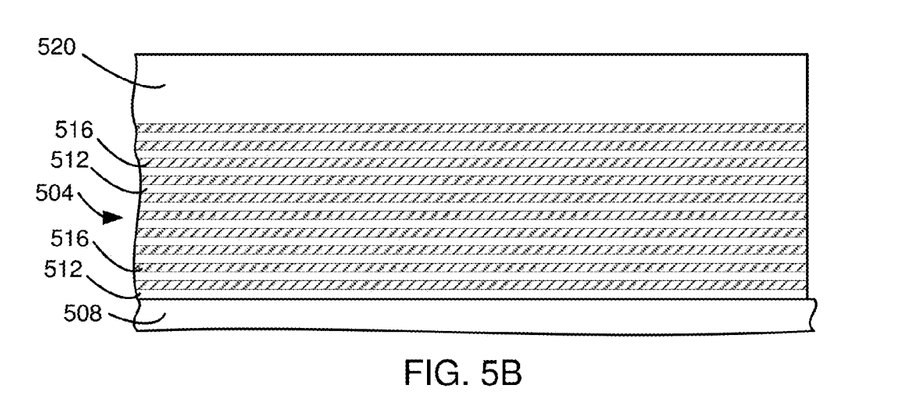

FIGS. 5A-5B are schematic cross-sectional views of an embodiment of a memory stack with alternating layers. A stack 504 may be formed over a substrate 508. One or more layers may be disposed between the stack 504 and the substrate 508. In this embodiment, the stack 504 is a plurality of memory stacks, which are formed by bilayers of a layer of silicon oxide ($SiO_2$) 516 on top of a layer of silicon nitride ($Si_3N_4$) 512.

A mask may be formed over the stack 504 (step 101). FIG. 5B is a cross sectional view of a stack 504 after a mask 520 is formed over the stack 504. In one embodiment, the mask is a carbon-containing mask, such as an organic mask, one example of which would be an amorphous carbon mask. An amorphous carbon mask may also include some amount of hydrogen and/or oxygen. In another embodiment, the mask is a hardened carbon mask which may contain a dopant such as, without limitation, boron or nitrogen. In illustrative embodiments, the mask may also be a silicon-containing mask, and the mask may, contain tungsten compositions such as $WO_x$, WN, or WC. Other masks may be used, and additional mask layers may be used above layer 520, depending on the application. Also, different orderings of the layers may be used, as adapted according to the level of skill in this art.

Figure 6A:
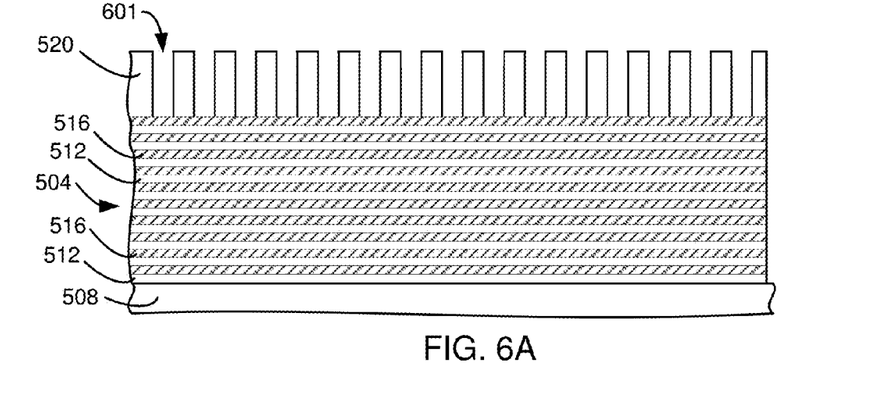
FIGS. 6A-6C are schematic cross-sectional views of a memory stack during etching.
Figure 6B:
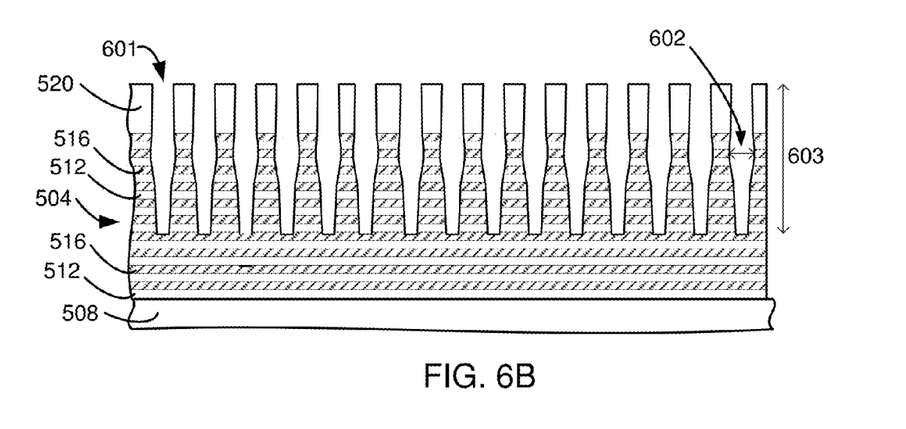
Figure 6C:
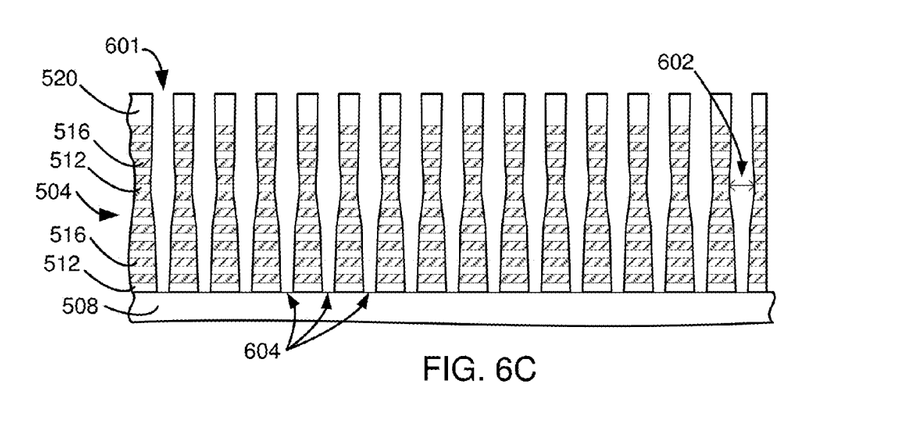

FIGS. 6A-6C are schematic cross-sectional views of a memory stack during etching, as viewed from the side. In FIG. 6A, a patterned mask has been formed by the creation of openings 602 in the mask 520 by methods known in the art, such as without limitation photolithography. FIG. 6B is a view after partial etch to etch depth 603, item 520 showing the remaining mask. A mid bow 602 has developed in the features during the etching process. This mid bow is a result of too much excavation of the vertical surfaces of the features, and is generally an unwanted consequence of etching. It may be determined by measuring the maximum width of the feature at a location somewhere between the top and the bottom of the feature.

In FIG. 6C, the features have been etched down to the substrate 508. Item 520 shows the remaining mask at this stage. Again, there are mid bows 602 for each feature, at a point part way between the top and the bottom of the feature. At the bottom 604 of the features 604, there may in one embodiment be a "dimple" in the underlying substrate, and etching proceeds a short distance into the substrate. At the bottom of the feature, the feature may have a cross-section. This cross-section may, in various embodiments, be circular or elliptical, or other shapes. The shape of the dimple is likely to correspond to the shape of the cross-section at the bottom of the feature.

Figure 7:
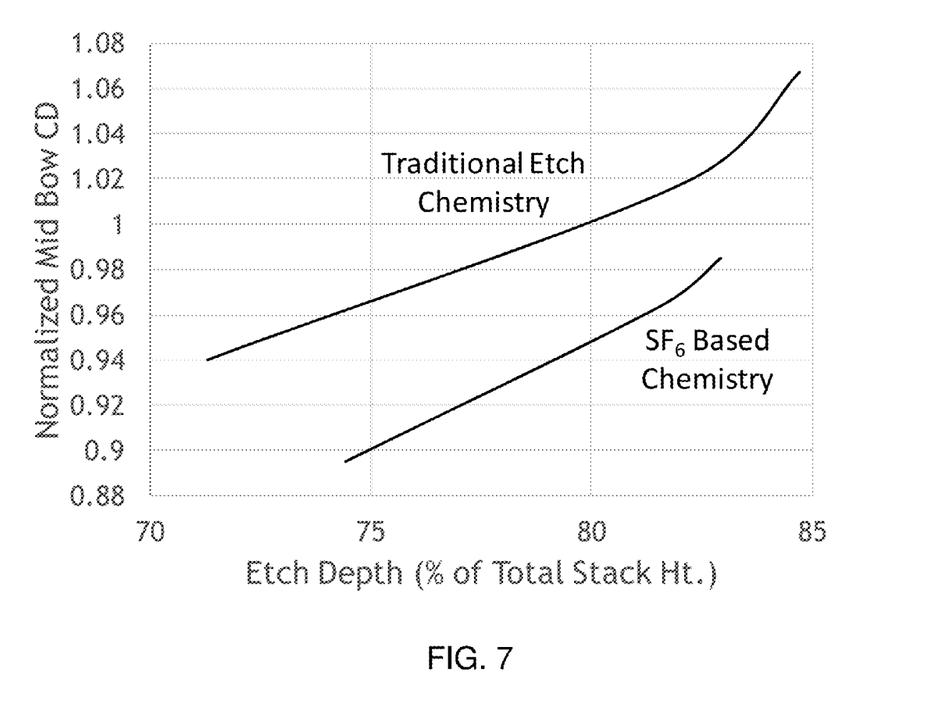
FIG. 7 is a graph illustrating an embodiment in which there is an improvement in mid-bow CD due to using $SF_6$.

FIG. 7 is a graph illustrating an embodiment of the inventions described herein, in which etching using $SF_6$-based chemistry is compared with traditional etching chemistry without sulfur-fluorine compounds. For each of the two chemistries, this is a plot of normalized mid bow CD versus the etch depth, expressed as the percentage of total stack height. At 75% etch depth, the graph shows approximately 7% improvement due to the use of the $SF_6$-based chemistry.

Figure 8A:
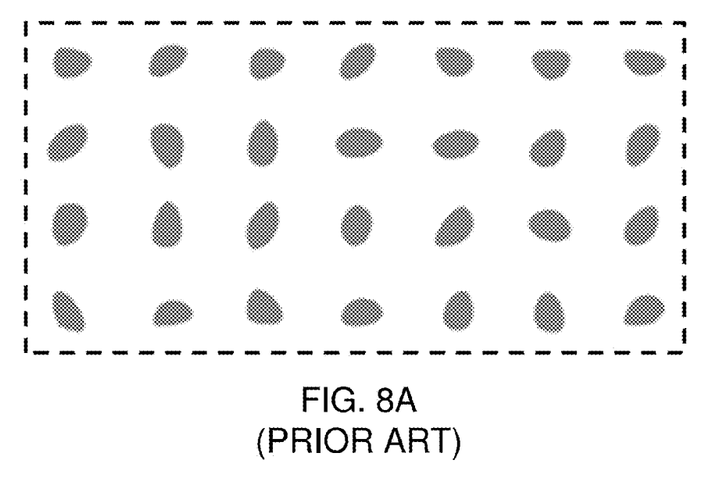
FIGS. 8A-8C are schematic representations of the cross-sections at the bottom of each section (top down view).
Figure 8B:
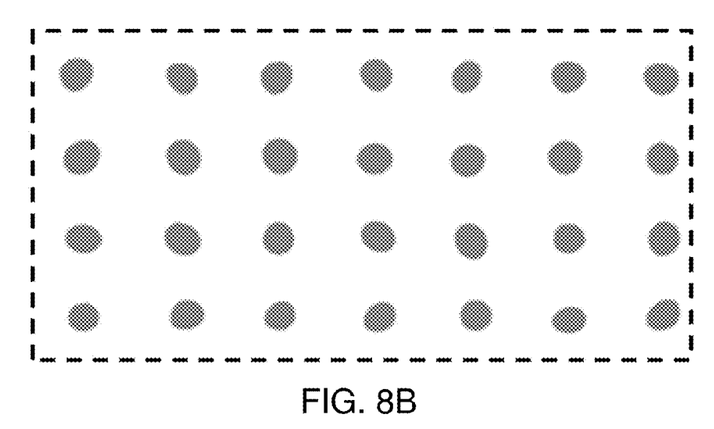
Figure 8C:
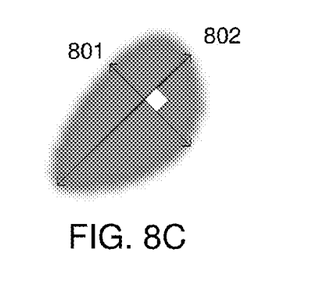

FIGS. 8A-8C are schematic representations of the cross-sections (items 604, FIG. 6C) at the bottom of each section, looking down from the top. Each of the oval shapes represents the cross-section of an etched feature. If the etching process proceeds down to the substrate 508, the ovals may also be approximately the shape of a dimple made in the substrate. FIG. 8A illustrates an example of the prior art, where the bottom cross-sections have high ellipticity. FIG. 8B illustrates an example of the inventions described herein, where the ellipticity is noticeably improved. Ellipticity may be calculated as shown in FIG. 8C, where the ellipticity is the ratio of two diameters taken along perpendicular axes, where the minimum diameter 801 is divided by the maximum diameter 802. A typical range of ellipticity for traditional chemistry in etching ONON structures would be 0.6-0.9 on average. In accordance with inventions disclosed herein, the ellipticity can be improved from a baseline process with 0.6-0.7 ellipticity to greater than 0.7, 0.8, and even 0.9 with simple addition of $SF_6$ to the chemistry backbone, even without other optimization measures, such as control of power or temperature, that may also improve ellipticity but may in many cases have tradeoffs. One may obtain a characteristic number for ellipticity of multiple features in a number of ways, such as by calculating the average ellipticity, or the minimum ellipticity. Ellipticities will vary depending on the ambiguity of the boundary being measured, or slight errors that may occur as a result of measuring the dimples in the substrate. Thus, approximations of ellipticities will incorporate that measurement error, which would be expected to include at least a variance of ±5% or more.

The worse ellipticity represents a property of feature profiles that is generally unwanted. One method of measurement may be to measure the "dimple" in the substrate material left over after stripping away the ONON mold, by means known in the art.

Example

In this example embodiment, a pressure of about 8-50 mTorr may be maintained in the chamber 304. The etching gas may comprise 20-80 sccm $C_4F_6$, 20-80 sccm $C_4F_8$, 3-5 sccm $SF_6$, 50-100 sccm $CH_2F_2$, and 50-120 sccm $O_2$. Different or additional components may be used, as discussed above. Also, various sub-ranges may be used, or the ranges extended depending on the circumstances. The amount of $SF_6$ may be approximately 1-6 molar percent of total flow, or 2-3%. The same ranges may be used, or ranges may be adapted (e.g., on a molar basis in terms of total sulfur atoms) for molecules containing multiple sulfur constituents. In other embodiments, $O_2$ may be omitted. In the present example, two different fluorocarbons were used. If one is used, or more than two are used, the concentrations may be adjusted accordingly (e.g., keeping the same total fluorocarbon concentration). In other embodiments, the etching gas composition ranges may include any sub-ranges, or may be expanded to include larger ranges in comparison to the present example, such as 10-100 sccm $C_4F_6$, 10-100 sccm $C_4F_8$, 2-6 sccm $SF_6$, 30-120 sccm $CH_2F_2$, and 30-150 sccm $O_2$. In addition to the above, some amount of an inert gas may be used. Inert gasses are those which are nonreactive in the context of the plasma chamber contents and conditions. Non-limiting examples of inert gasses may include a noble gas (such as Ar or others). In one embodiment, the inert gas is about 0-10 mole % of the total flow, or in another embodiment, 25 mole %, or higher, depending on the regime. When approximating mole percentages, it is expected that flow rates and concentration levels vary as a result of normal flow and mixture characteristics of the system. That normal variation would be within the range of approximation, and this would be expected to include at least ±20%.

To form the etching gas into a plasma, RF power may be in the form of a continuous wave (CW), although a pulse waveform may equivalently be used. The apparatus may use a dual frequency source (2 and 60 MHz, for example), or in another embodiment a three-frequency source (2, 27, and 60 MHz, for example). In this example, 500-2000 watts (average) or 500-2500 watts (peak power) of RF may be provided at 60 MHz, and the same range may be used for 27 MHz. Power in the general range of 4-10 kW (average) or 5-15 kW (peak power) may also be supplied at 2 MHz. Embodiments may also include any sub-ranges of the above power ranges, or even wider ranges. Frequencies described herein are approximate, and may vary according to the variance of standard power sources in the field.

In this example, the cross-section of the bottom of each feature is measured by stripping the stack and looking at the "dimples" in the substrate, which have an ellipticity defined as the minimum diameter divided by the maximum diameter, the two diameters taken along perpendicular axes, such that the average (or alternatively, minimum) ellipticity for the features is at least about 0.9.

While inventions have been described in terms of several preferred embodiments, there are alterations, permutations, and various substitute equivalents, which fall within the scope of this invention. There are many alternative ways of implementing the methods and apparatuses disclosed herein. It is therefore intended that the following appended claims be interpreted as including all such alterations, permutations, and various substitute equivalents as fall within the true spirit and scope of the present invention.

What is claimed is:

1. A method for etching a plurality of features in a stack comprising at least one layer above a substrate, comprising:
   providing a steady state flow of an etching gas, wherein the etching gas comprises:
      a molecule A comprising sulfur and fluorine;
      a molecule B comprising carbon, fluorine, and hydrogen; and
      a molecule C comprising carbon, fluorine, and not hydrogen;
   forming the etching gas into a plasma; and
   etching the features with an aspect ratio of greater than about 30:1 into the stack through the at least one layer, wherein the at least one layer comprises a plurality of alternating layers and wherein the number of features is at least 5, wherein the cross-section of the bottom of each feature has an ellipticity defined as the minimum diameter divided by the maximum diameter, the two diameters taken along perpendicular axes, and wherein the average ellipticity for the features is at least about 0.8.

2. The method of claim 1, wherein the alternating layers are silicon dioxide and silicon nitride.

3. The method of claim 1, wherein molecule A is $SF_6$.

4. The method of claim 1, wherein molecule B is a hydrofluorocarbon.

5. The method of claim 4, wherein the hydrofluorocarbon is selected from the group consisting of $CHF_3$, $CH_2F_2$, and $CH_3F$.

6. The method of claim 1, wherein molecule C is a fluorocarbon.

7. The method of claim 5, wherein the fluorocarbon is selected from the group consisting of $C_4F_6$ and $C_4F_8$.

8. The method of claim 1, wherein the mole percent of molecule A in the etching gas is between about 1% and about 6%, inclusive.

9. The method of claim 8, wherein the mole percent is between about 2% and about 3%, inclusive.

10. The method of claim 1, wherein the aspect ratio is greater than about 60:1.

11. The method of claim 1, wherein the average ellipticity for the features is at least about 0.9.

12. The method of claim 11, wherein the minimum ellipticity for the features is at least about 0.9.

13. The method of claim 1, wherein the ratio of molecule A to molecule B is between about 1:5 and about 1:15.

14. The method of claim 1, wherein the at least one layer is a layer of silicon dioxide.

* * * * *